United States Patent [19]

Morita et al.

[11] Patent Number: 4,758,953

[45] Date of Patent: Jul. 19, 1988

[54] METHOD FOR GENERATING LOGIC CIRCUIT DATA

[75] Inventors: Masato Morita; Yukio Ikariya; Yoshinori Sakataya; Masayuki Miyoshi, all of Hadano, Japan

[73] Assignee: Hitachi, Ltd., Tokyo, Japan

[21] Appl. No.: 102,771

[22] Filed: Sep. 23, 1987

Related U.S. Application Data

[63] Continuation of Ser. No. 687,907, Dec. 31, 1984, abandoned.

[30] Foreign Application Priority Data

Dec. 30, 1983 [JP] Japan ................................ 58-247651

[51] Int. Cl.⁴ ............................................. G06F 15/60
[52] U.S. Cl. ..................................... 364/300; 364/490
[58] Field of Search ........ 364/491, 490, 900 MS File, 364/200 MS File, 488, 300

[56] References Cited

U.S. PATENT DOCUMENTS

| 4,020,466 | 4/1977 | Cordi | 364/200 |
|---|---|---|---|
| 4,084,231 | 4/1978 | Capozzi | 364/200 |
| 4,263,651 | 4/1981 | Donath et al. | 364/491 |
| 4,464,712 | 8/1984 | Fletcher | 364/200 |
| 4,584,653 | 4/1986 | Chih et al. | 364/491 |
| 4,600,995 | 7/1986 | Kinoshita | 364/491 |
| 4,602,339 | 7/1986 | Aihara | 364/491 |
| 4,607,339 | 8/1986 | Davis | 364/491 |
| 4,612,618 | 9/1986 | Pryor | 364/490 |
| 4,613,940 | 9/1986 | Shenton et al. | 364/488 |

Primary Examiner—Gary V. Harkcom
Assistant Examiner—Lawrence E. Anderson
Attorney, Agent, or Firm—Antonelli, Terry & Wands

[57] ABSTRACT

In automatic development of the higher hierarchic logic into the lower hierarchic logic in a hierarchic logic designing, identification codes are beforehand assigned to logic components of the higher hierarchic logic, and the identification codes are also assigned to the lower hierarchic logic data when developing the higher hierarchic logic into the lower hierarchic logic in order to establish correspondences between the higher and lower hierarchic logic, thereby allowing a higher-speed logic compare operation with respect to a design change on the higher or lower hierarchic logic and enabling the automatic update of the lower hierarchic logic by use of the higher hierarchic logic as the master.

5 Claims, 4 Drawing Sheets

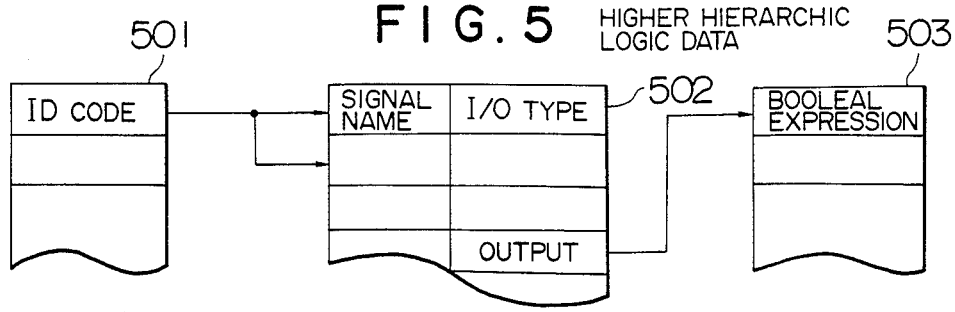
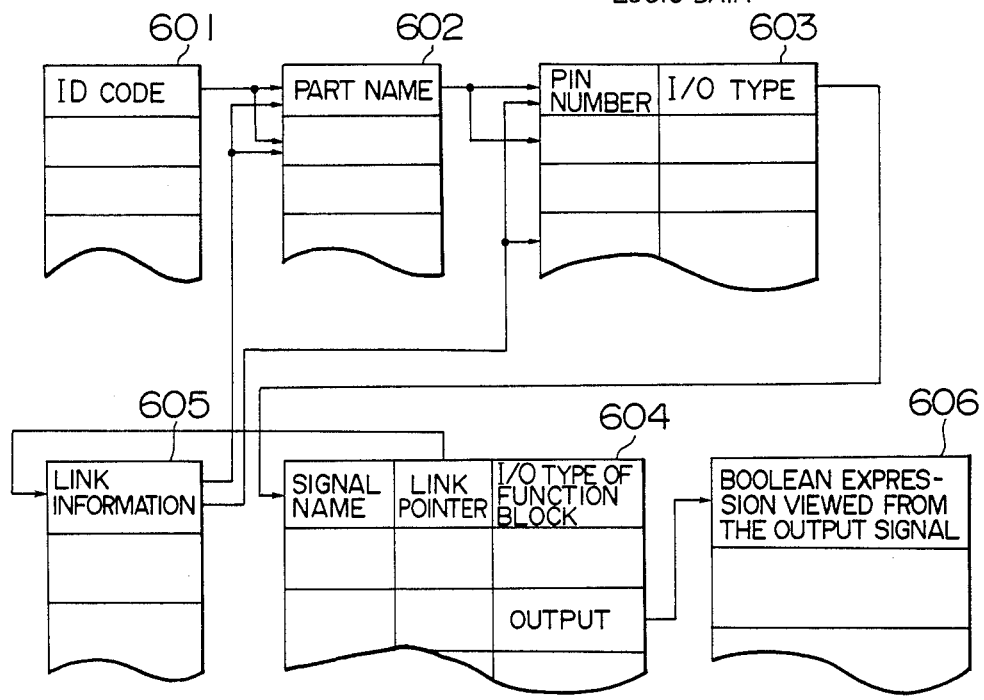
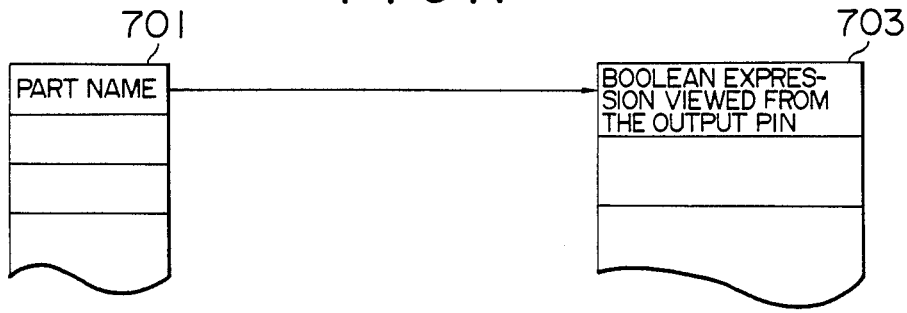

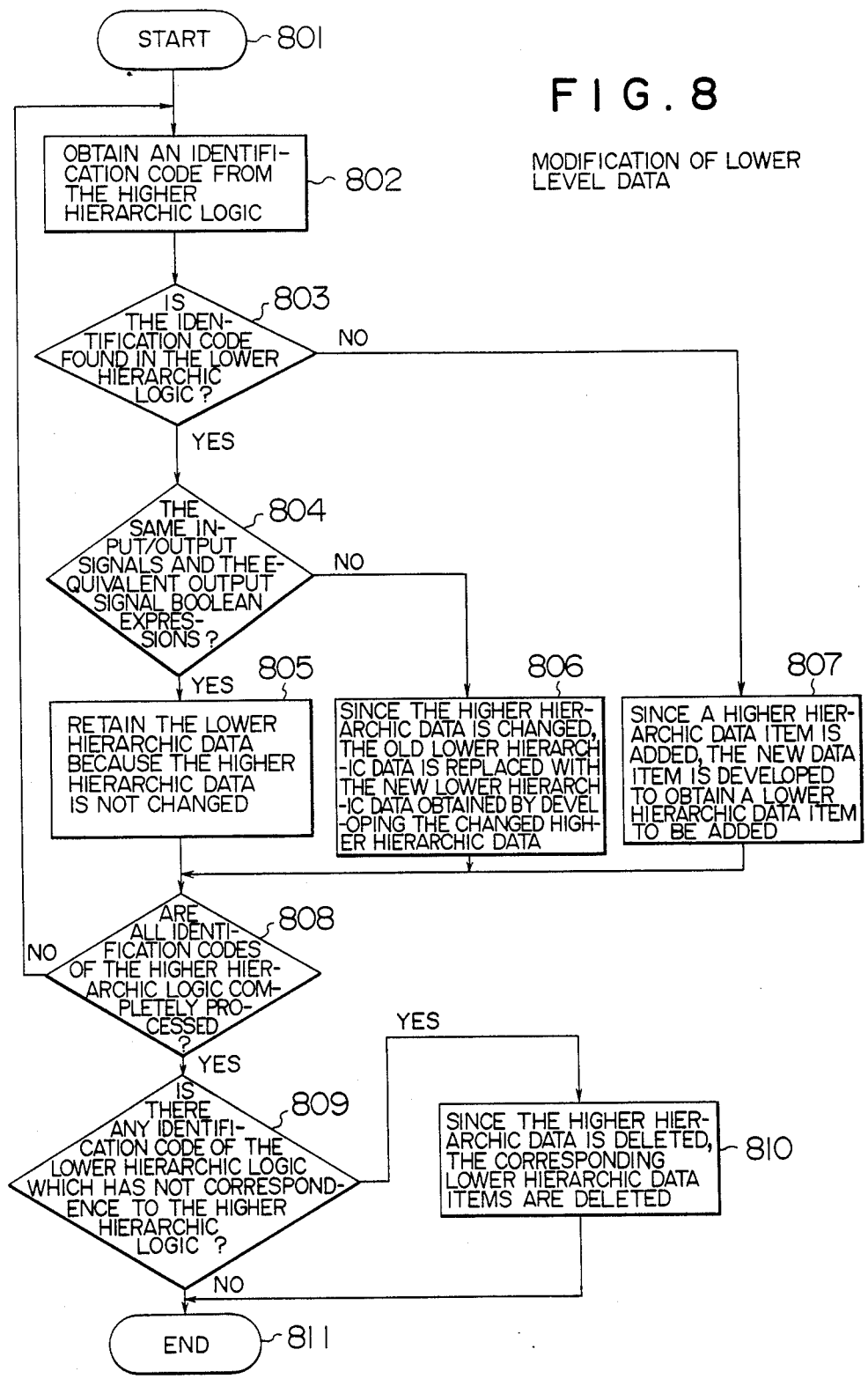

METHOD FOR GENERATING LOGIC CIRCUIT DATA

This application is a continuation of application Ser. No. 687,907, filed Dec. 31, 1984, now abandoned.

BACKGROUND OF THE INVENTION

1. Field of the Invention

The present invention relates to a logic designing system for designing digital logic devices, and in particular, to a method for generating data of a logic circuit suitable for automatically comparing and modifying logic expressed with the higher and lower hierarchic data for a design change of a hierarchic logic designing.

2. Description of the Prior Art

In production of integrated semiconductor circuits as well as printed circuits, there is required a process for determining combinations of circuit elements and placement thereof to provide such circuits with respective desired functions. After the process is completed, various masks are created by use of data generated in this process. The data items are generated in a data system having two hierarchic data levels: One is a higher hierarchic level assigned to data represented by a group of function blocks of boolean expressions for logical functions of an integrated semiconductor circuit, the other is a lower hierarchic level assigned to data created in association with the higher hierarchic data and which represents combinations of circuit elements. The correspondences between the higher and lower hierarchic data items must be obtained in order to check whether or not the data at the higher hierarchic level has been properly developed with respect to the lower level data items and to modify the corresponding lower hierarchic data items when higher level items are changed, for example, because of a design change or because a logic is modified based on a result obtained from a check on the amount of signal delay due to lower level data items.

For the data modification, the information about the data correspondences between the higher and lower hierarchic data items is not necessary if all the data items at higher hierarchic level are converted again into the lower level data items; however, the lower hierarchic data items converted from the higher level data items are in general assigned with layout information such as part names, mounting placement information, and pin numbers. Consequently, when all data items at the higher hierarchic level are converted again, the layout information must be also assigned in addition. It is therefore desirable to partially convert only the modified data items.

Conventionally, since the notation varies between the higher and lower hierarchic data items, the signal names are assigned by use of the different assigning systems. In order to establish the correspondences between the higher and lower level data items, a correspondence table representing the correspondences between the signal names thereof is manually generated.

However, a considerable human power is required to create the correspondence table and there exist problems to be solved that the operation for obtaining a correspondence between functional blocks from the correspondence table is not an easy job and that the table must be generated again if a signal name is modified.

SUMMARY OF THE INVENTION

It is therefore an object of the present invention to overcome the above-mentioned problems and to provide a method for partially modifying the data items at the higher and lower hierarchical levels when a data modification thereof takes place due to a design change in a system having circuit data expressed with multiple hierarchic levels, thereby reserving the logic data to be equivalent.

In accordance with the present invention, each function block of the higher level data and a corresponding logic data of the lower level data are checked to confirm whether or not they match with each other and the portion of the lower hierarchic data to be regenerated is determined for each function block, thereby enabling the partial modification to be conducted on the data items at the lower hierarchic level.

BRIEF DESCRIPTION OF THE DRAWING

The present invention will be apparent from the following detailed description taken in conjunction with the accompanying drawings in which:

FIG. 5 illustrates examples of tables for controlling the higher hierarchic data.

FIG. 6 depicts examples of tables for controlling the lower hierarchic data.

FIG. 7 shows tables for generating the tables depicted in FIG. 6.

FIG. 8 is a flowchart of a modification processing to be executed on the lower level data in association with a data modification in the higher level data of an embodiment of the present invention.

DESCRIPTION OF THE PREFERRED EMBODIMENT

Figure 1:
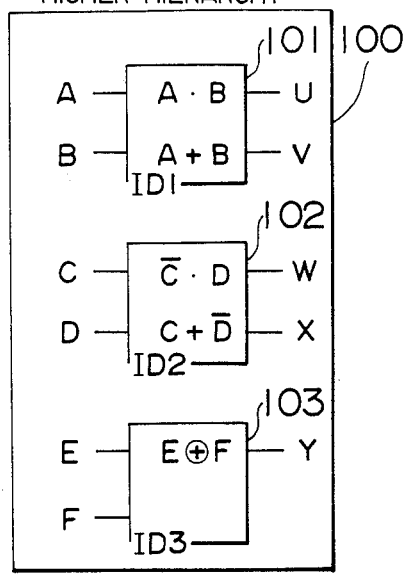
FIG. 1 and FIG. 2 are schematic diagrams of examples of logic for the higher and lower hierarchic levels, respectively of an embodiment of the present invention.
Figure 2:
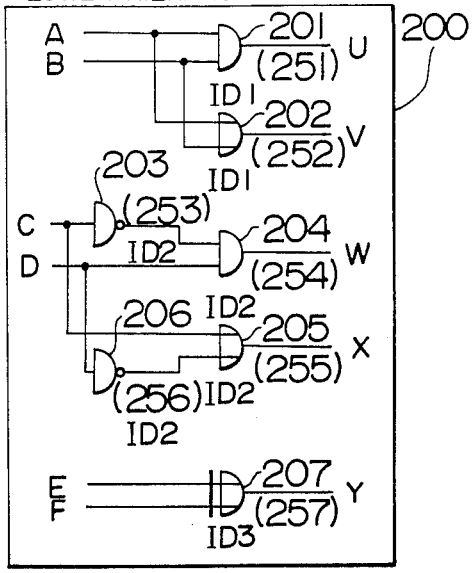

FIG. 1 depicts an example of a portion of the higher hierarchic data, while FIG. 2 represents a portion of the lower hierarchic data corresponding to that shown in FIG. 1.

The diagram of FIG. 1 comprises a logic of the higher hierarchic level 100 and logic sets of boolean expressions 101–103. It further includes input signal names A to F and output signal names U to Y of the respective logic sets. Identification codes ID1, ID2, and ID3 are assigned to the logic sets 101, 102, and 103, respectively to identify the logic sets in accordance with the present invention.

The schematic diagram of FIG. 2 comprises a logic of the lower hierarchic level 200 obtained by developing the higher level logic 100 of FIG. 1. It further includes gates 201–207 and input signal names A to F and output signal names U to Y, respectively corresponding to FIG. 1. The same identification (ID) name is assigned to the equivalent signals in the data at the higher and lower hierarchic levels. Identification codes ID1 to ID3 are indicated below the gates 201–207, respectively corresponding to the higher level logic of FIG. 1. Although not shown here, the signals which appear in logic sets after the lower level logic is developed (on lines between the gates 203 and 204 and between gates 205 and 206) must be named by use of a naming rule which allows the names to be easily distinguished from the input/output signals of the logic sets. The diagram of FIG. 2 also comprises mounting position information enclosed with parentheses. A method for comparing the logic between the higher and lower hierarchy levels will be described. The logic comparison is conducted through the following three steps.

Step 1: Identification code check for the missing and excessive logic elements (whether a logic element having an identification code in the logic block 100 is found in the logic block 200, and whether a logic element having an identification code which should not exist in the logic block 100 is found in the logic 200).

Step 2: Logic set input/output signal check for the missing and excessive input/output signals (It is checked whether or not there exist any missing or excessive input/output signals with respect to an associated function block and logic elements.).

Step 3: Comparison of boolean expressions of logic set output signals (Whether a logic element of the logic block 200 with an identification code has the equivalent function in a boolean expression of a function block represented by the same identification code.).

Figure 3:
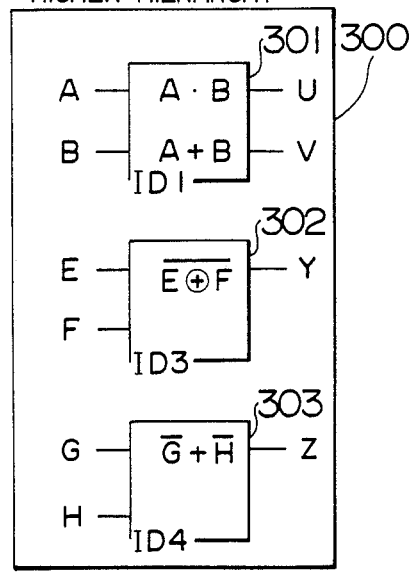
FIG. 3 and FIG. 4 are schematic diagrams of other examples of logic for the higher and lower hierarchic levels, respectively of an embodiment of the present invention.
Figure 4:
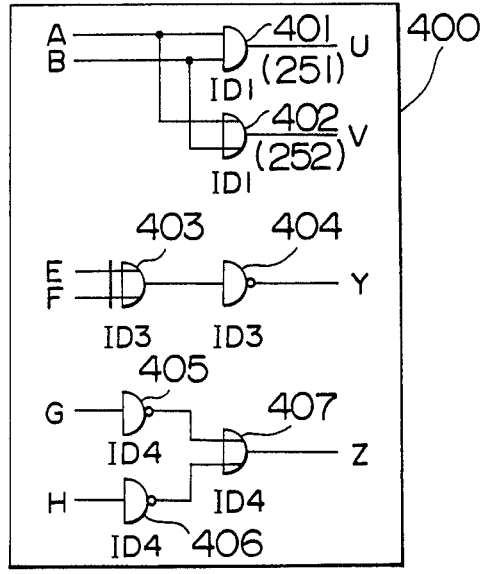

Next, an example in which the logic correspondence cannot be properly reserved between the higher and lower hierarchic levels, for example, due to a design change will be described hereinbelow. The schematic diagram of FIG. 3 represents a logic of the higher hierarchic level 300 comprising logic sets of boolean expressions 301–303, and input signals A, B, and E to H and output signals U, V, Y, and Z of the logic sets 301–303, respectively. The diagram of FIG. 4 depicts a logic of the lower hierarchic level 400 developed from the higher level logic 300 of FIG. 3 and which comprises gates 401–407, and signal names A, B, E to H, U, V, Y, and Z, respectively corresponding to those of FIG. 3. Identification codes ID1, ID3, and ID4 are assigned to FIG. 3 and FIG. 4 in accordance with the present invention. Assume that the equivalence of the logic is guaranteed according to the relationships depicted in FIG. 1 and FIG. 2 and that the logic of the higher hierarchic level is changed from FIG. 1 to FIG. 3 due to a design modification. The three-step logic comparison described above is carried out assuming that FIG. 3 and FIG. 2 represent the higher and lower hierarchic levels as follows.

Step 1: Excessive and missing function elements are found. In the lower level logic 200 of FIG. 2, ID2 for gates 203–206 are excessive and ID4 is missing (i.e. the pertinent gates are not found).

Step 2: The correspondence between ID1 and ID3 is established (i.e. they exist in the logic blocks 100 and 200). There exists no excessive or missing input/output signal. That is, the correspondence between the logic set ID1 with the signals A, B, U, and V and the logic set ID3 with the signals E, F, an Y is properly established including the input and output signal types.

Step 3: The logical set ID1 is logically equivalent, while there exists a logical inconsistency in the logic set ID3. That is, although the output signals U=A·B and V=A+B from the logic set ID1 are identical in FIG. 3 and FIG. 2, the output signal Y from the logic set ID3 is $\overline{E \oplus F}$ in FIG. 3 and $E \oplus F$ in FIG. 2.

The equivalence of the logic for each logic set can be thus proved by use of the steps 1–3. In order to guarantee the logic by assuming the logic of the higher hierarchic level to be true based on above-stated results, the logic set of lower hierarchic logic whose identification code is ID1 is reserved, the logic set of the lower level logic whose identification code is ID2 is deleted, the logic set whose identification code is ID3 is replaced with the logic set obtained by developing the higher hierarchic logic again (to generate the gates 403 and 404 of FIG. 4), and a logic set whose identification code is ID4 is developed from the higher level logic (to generate the gates 405–407 of FIG. 4). In this case, if human work such as logic optimization and layout information addition are not conducted after the logic of the lower hierarchic level is obtained before an update takes place, all logic sets may be developed again. However, if there is added such information to be retained as, for example, additional information including the layout information represented by the mount information enclosed in parentheses in FIG. 2 and FIG. 4, the procedure described above makes it possible to reserve the lower level logic sets (associated with the gates 201 and 202 of FIG. 2 and the gates 401 and 402 of FIG. 4) which are not related with the design change with the additional information kept possessed. The mount information of the present invention is a number assigned to each area obtained by subdividing the area of an integrated semiconductor circuit substrate.

Means for executing the logic comparison between the higher and lower hierarchic levels and means for updating the lower-level hierarchic logic by use of the higher-level hierarchic logic as the master will be described in the form of data processing on a computer by referring to FIG. 5 to FIG. 8.

FIG. 5 to FIG. 7 illustrate tables created on the main storage, while FIG. 8 is a flowchart of processing to be executed under control of programs in a computer.

FIG. 5 depicts tables generated in association with the data of the higher hierarchic level and which are stored on a store medium of the higher level logic. The diagram of FIG. 5 comprises an identification (ID) code table 501 in which all identification codes belonging to the higher hierarchy are arranged in a preset order. A signal name table 502 to which the signal names are registered together with associated input/output type codes is pointed to by an identification code of a related logical block in the identification code table 501. A boolean table 503 to which a boolean expression representing an output of each output signal is registered is pointed to by an output signal in the signal name table 502.

FIG. 6 illustrates tables generated in association with the data at the lower hierarchic level and which are stored on a store medium of the lower hierarchic logic. The diagram of FIG. 6 comprises an identification code table 601 in which all identification codes belonging to the lower level logic are arranged in a predetermined order. A part name table 602 for storing the part names as many as there are parts used in the lower level logic is pointed to by the identification code table 601. Since a plurality of parts each having the same identification code may exist in the lower hierarchy, several part names are possibly pointed to by an identification code in such a case.

A pin table 603 is provided to register thereto the pin numbers of all pins (signal lines) used in the lower hierarchic logic, each pin number being stored together with an input/output type code indicating whether or not the pin is utilized to input or to output a signal with respect to the pertinent part. The pin table 603 is pointed to by a part name associated with a pin stored in a part name table in which the pin name of the pin is stored. A signal name table 604 is utilized to register thereto all input/output signals and internal signals each together with an input/output type code indicating whether or not the signal is an input or output signal for a function block to which an original identification code is assigned with the higher level logic data. A link table 605 to which a link information between the signal name table 604 and the pin table 603 is registered to establish correspondences between all signal names and part pins associated with the lower hierarchic logic is pointed to by a link pointer of the signal name table 604. This provision is used to inversely search a pin number with a signal name.

Excepting the input and output end points of the function blocks, a signal passes at least two pins. A field indicated by a link pointer of the link table 605 contains all addresses on the pin table 603 with respect to all the pins associated with the signal. Furthermore, the pertinent address of the part name table 602 corresponding to a part name associated with the signal is also stored therein.

A boolean table 606 to which the boolean expressions viewed from the output signals are registered is pointed to by an output signal stored in the signal name table 604.

FIG. 7 depicts part information tables generated from a part library recording medium and comprises a part name table 701 to which the part names are registered in accordance with the number of types of parts used in the lower hierarchic logic. A boolean table 703 is utilized to register thereto the boolean expressions with respect to input pins representing logic functions viewed from the output pins associated with a part indicated by a part name on the part name table 701.

Excepting the input/output fields of the function blocks in the signal name and the table 606, the tables illustrated in FIG. 5 to FIG. 7 can be generated by writing in the pertinent fields thereof the data items sequentially read from the higher and lower hierarchic data. The input/output fields of the function blocks in the signal name table 604 are generated as follows. Each signal name is sequentially read from the signal name table 604 and the following processing is executed for the signal name. The link information 605 is read by use of a link pointer associated with the signal name, and the table 603 is searched by use of the addresses of all pin numbers in the table 603 which are registered to the link information field in order to check the corresponding input/output type codes. If it is found, as a result, that there exist only output pins, the signal names indicate the output signals from a function block, hence an information indicating an output is stored in the input/output field of the table 604. If there exist only input pins, the signal names indicate the input signals to a function block, so that information indicating an input is stored in the input/output type field of the table 604. If input and output pins are found, the signal names indicate the internal signals in a function block, so no data is written in the table 604.

Next, a procedure for creating the table 606 will be described. The following processing is carried out with respect to each signal name for which the input/output type code of the table 604 indicates an output. The link information 605 is read by use of a link pointer, and the table 602 is read with the part name addresses registered thereto, then the table 701 is indexed with the obtained part name. The table 703 is read by use of an address obtained as a result in order to acquire a boolean expression representing the function associated with the part. The boolean expression is stored in a work area (not shown). Next, a pin number is indexed by use of the same link information 605, then a signal name is accessed with the signal name. If the obtained signal name is different from the signal name previously acquired, a part name is read again from the table 602 by use of the link information 605. A boolean expression representing the function of the corresponding part is obtained by use of the part name and is linked to the previous boolean expression stored in the work area.

This processing is repeated up to a signal name having the input type code in table 604. As a result, a boolean expression in which an output signal is represented with input signals of the relevant function block is obtained and is stored in the table 606.

The processing described above is carried out for all signal names for which the output information is registered in the table 604.

Next, execution of a logic comparison will be described. In the step 1 for checking the identification code for excessive and missing function elements, the identification code table 501 of FIG. 5 is compared with the identification code table 601 of FIG. 6. Step 2 to check for excessive and missing input/output signals is carried out only for the identification codes that are found in both higher and lower hierarchic logic by the check of step 1, and the table 502 is thus compared with the table 604.

For any identification code for which all signal names are found to be consistent in step 2 above, step 3 for comparing boolean expressions of output signals is carried out by comparing a boolean expression in the table 503 pointed to by the signal name having the output type code in the table 502 with one in the table 606 pointed to by the signal name having the output type code in the table 604.

The comparison of boolean expressions can be executed in accordance with the method explained in "Binary Decision Diagrams" by Sheldon B. Akers, 1978, IEEE.

An update procedure for updating the lower hierarchic logic by use of the higher hierarchic logic as the master will be described by referring to FIG. 8.

FIG. 8 depicts a flowchart of the update procedure in which reference numerals 801 and 811 indicate terminals, reference numerals 802, 805-807, and 810 represent respective processing, and reference numerals 803, 804, 808, and 809 indicate judge operations, respectively.

When the higher hierarchic data is modified due to a design change or the like cause, the processing described in the following paragraphs is performed by use of the tables illustrated in FIG. 5 and FIG. 6.

The processing is initiated (step 801).

An identification code is obtained from the higher hierarchic logic (step 802). A check is made to determine whether or not the pertinent identification code is found in the lower hierarchic logic. If the identification code exists, control is passed to step 804, otherwise, the processing is branched to step 807. In the former case, it is checked whether or not the input/output signal names of the logic set are the same and the output signal boolean expressions are equivalent to each other. If they are equivalent, control is transferred to step 805, otherwise, it is passed to step 806 (step 804). When they are found to be equivalent, the logic set of the higher hierarchy has not been changed, hence the relevant logic set of the lower hierarchic logic is retained (step 805). If they are not equivalent, the logic set of the higher hierarchic logic is assumed to have been changed, so the existing logic set of the lower hierarchic logic is replaced with an associated logic set obtained by developing the changed logic set of the higher hierarchic logic (step 806).

When it is found in step 3 that the relevant identification code is not found, the logic set of the higher hierarchic logic is assumed to have been added, so an associated logic set of the lower hierarchic logic is developed therefrom and is added to the lower hierarchic logic (step 807).

Next, it is checked whether or not all identification codes of the higher hierarchic logic have been completely processed (step 808). If this is the case, control is passed to step 809, otherwise, the processing is branched to step 802.

When all identification codes have been processed, the program checks whether or not there exists any identification code of the lower hierarchic logic that has no correspondence to the higher hierarchic logic (step 809). If such an identification code is found, the processing proceeds to step 810, otherwise, control branches to step 811.

In the former case, the function block having the identification code of the higher hierarchic logic is assumed to have been deleted, the corresponding data items of the lower hierarchic logic are entirely deleted (step 810). When the check results in NO in step 809 or when the processing of step 810 is finished, the processing for modifying the lower hierarchic data is terminated (step 811).

As described above, the data modification can be limited to the logic set involved in the data change, and the other logic sets not related to the data change are retained. When the logic optimization and layout information addition are manually carried out by human work after the higher hierarchic logic is developed to obtain the corresponding lower hierarchic logic, above-mentioned partial update of the lower hierarchic logic is considerably effective to eliminate need for the manual operation for adding such information again.

The following paragraphs describe the operation of a design modification by use of the higher hierarchic logic as the master in a case where the higher and lower hierarchic logic blocks have been obtained through a develop operation for developing the lower hierarchic logic from the higher hierarchic logic.

Figures 9, 10:
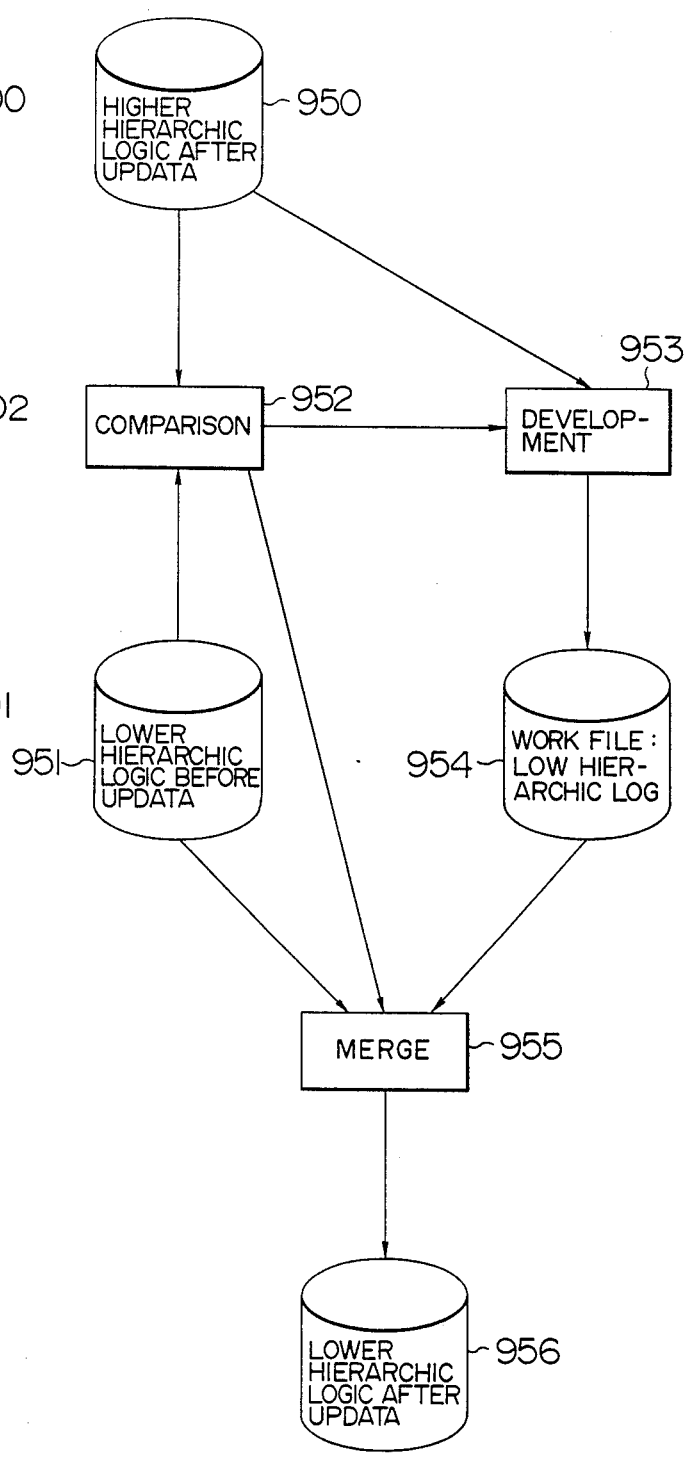
FIG. 9 depicts a schematic diagram of a data generation to be conducted to create lower hierarchic data in an embodiment of the present invention.
FIG. 10 is a schematic representation of a data generation showing a general concept of processing for creating the lower level data in an embodiment of the present invention.

FIG. 9 illustrates an operation flow diagram applicable to the first operation for generating the lower hierarchic logic from the higher hierarchic logic. This diagram includes a design file 900 in which the higher hierarchic logic (equivalent to the logic depicted in FIG. 3), a design file 901 for storing the lower hierarchic logic (equivalent to the logic illustrated in FIG. 2), and a develop processing 902. The data items of the higher hierarchic data are generated by assigning the identification names ID1, ID2, and ID3 to the logical sets 101, 102, and 103 belonging to the higher hierarchic logic 100 as shown in FIG. 1, and the created data is stored in the design file 900. The higher hierarchic data is read and undergoes a logic simulation for the data evaluation, and a data modification is conducted depending on the evaluation results. Next, the develop processing 902 is carried out with the data of the higher hierarchic logic stored in the design file 900 in order to generate the data of the lower hierarchic logic 200 having the configuration as depicted in FIG. 2. In this development, the identification codes ID1, ID2, and ID3 are also transferred to and developed in the data of the lower hierarchic logic 200. The created lower hierarchic logic data is stored in the design file 901. The lower hierarchic logic data is then read from the design file 901 to calculate the delay time of signal propagation, and a data modification is carried out if required by the calculated result.

FIG. 10 is an operation flow of a design modification conducted by using the higher hierarchic logic as the master after the higher and lower hierarchic logic data is generated. This diagram includes a design file 950 for storing therein the higher hierarchic logic data updated due to a design change, a design file 951 for storing therein the lower hierarchic logic data before the design change, a work file 954 for storing therein the lower hierarchic logic data created by partially developing only the logic sets having the identification codes associated with the design change (addition and modification) and which are obtained from the design file 950 containing the higher hierarchic logic data, and a design file 956 for storing therein the updated data of the lower hierarchic logic. The diagram of FIG. 10 further comprises a compare processing 952 for comparing the updated higher hierarchic logic data stored in the design file 950 with the lower hierarchic logic data before the update stored in the design file 951 and a develop processing 953 for partially developing only the logic sets having the identification codes associated with the design change and which are obtained from the design file 950 containing the updated higher hierarchic logic. A compare/merge processing 955 receives the unmatched identification codes resulting from the compare processing 952, obtains the logic sets having the matched identification codes from the design file 951, and sequentially inputs the logical sets corresponding to the unmatched identification codes from the work file 954, then performs a merge operation with the received data. In the compare processing 952, the updated higher hierarchy logic data is compared with the lower hierarchic logic data before the data update operation in order to identify the logic sets associated with the design change by use of the identification codes. (If the higher hierarchic logic 100 of FIG. 1 has been modified to be the higher hierarchic logic 300 of FIG. 3, ID1 is identified to be an identification code for retaining the data, ID2 is recognized to be an identification code for the data deletion, ID3 is regarded as an identification code for modifying the data, and ID4 is recognized to be an identification code for adding the data.) In the develop processing 953, the unmatched identification codes are obtained from the compare processing 952, and the lower hierarchic logic data is generated by partially developing only the logic sets having the identification codes associated with the design change and which are obtained from the design file 950, then the created lower hierarchic logic data is stored in the work file 954. (In this example, the lower hierarchic logic elements 403-407 of FIG. 4 are generated by partially developing only the logical sets 301 and 303 associated with the identification codes ID3 and ID4, respectively.) In the merge processing 955, the lower hierarchic logic data after the design change is created by sequentially merging the data of the logic sets associated with the matched identification codes (in this example, the logic elements 201 and 202 of FIG. 2 belonging to the lower hierarchic logic before the update and which are corresponding to the identification code ID1) and the data of the logic sets associated with the data addition and modification and which are selected from the logical sets corresponding to the unmatched identification codes received from the compare processing 952. The created lower hierarchic logic data after the design change is then stored in the design file 956.

The initial develop processing of FIG. 9 is available for developing the higher hierarchic logic again into the lower hierarchic logic. The development to be conducted for a design change illustrated in FIG. 10 is especially effective when other than the logic information, for example, a mounting information is added to the design file containing the lower hierarchic logic after the initial development, thereby making it possible to prevent the information other than the logic information from being cleared by the initial development and to eliminate the need for the operation to add such information.

Although the development of FIG. 10 associated with a design change is an example to modify the lower hierarchic logic by changing the higher hierarchic logic, the development related to a design change carried out with respect to the logic sets having the identification codes ID1, ID2, and ID3 as described above can be naturally applicable to a case in which the higher hierarchic logic is modified after the lower hierarchic logic is changed.

In accordance with the embodiment described above, the logic compare operation between the higher and lower hierarchic logic can be executed in a higher speed and the update processing to guarantee the equivalence of the logic can be easily performed by assigning identification codes such as ID1, ID2, ID3, and ID4 to logical sets of the higher and lower hierarchic logic as illustrated in FIG. 2.

In accordance with the present invention, the equivalence in the logic of the higher and lower hierarchies can be verified in a higher speed and the unmatched locations found can be limited to the logic sets indicated by the corresponding identification codes without greately increasing the number of manual design processed by human work in a hierarchic logic designing of a digital logic device, thus the update for guaranteeing the logic equivalence can be easily performed and the information added to the lower hierarchic logic can be retained to the maximum extent.

We claim:

1. A method for checking a logic circuit made up of one or more function blocks each capable of performing a logic operation on one or more input signals to produce one or more output signals, each function block being formed of one or more logic elements, comprising the steps of:

(a) storing respective first identification codes for each of said function blocks in a first memory of an information processing system;

(b) storing said respective first identification codes in a second memory of said information processing system in correspondence to each of the logic elements which form the respective function blocks;

(c) storing second identification codes for each of the input signals and output signals for each function block in said first memory in correspondence to said first identification codes and in said second memory in correspondence to said logic elements which form the respective function blocks;

(d) storing third identification codes for each of the logic operations performed by said function blocks in said first memory and said second memory in correspondence to the second identification codes representing output signals therein;

(e) modifying the identification codes stored in said first memory in response to modification of said logic circuit to add, delete and/or replace a function block and/or the input and/or output signals associated therewith;

(f) determining whether each of the first identification codes stored in said first memory is contained in said second memory;

(g) determining whether the second identification codes in said first memory, for those function blocks for which the first identification codes have been found in both said first memory and said second memory in step (f), are stored in said second memory for the logic elements of those function blocks; and (h) determining whether the third identification codes in said first memory, for those function blocks for which the same second identification codes are stored in said first memory and said second memory as determined in step (g) are stored in said second memory for the second identification codes therein representing output signals.

2. A method according to claim 1, wherein, when a first identification code stored in said first memory is not found in said second memory, storing in said second memory first, second and third identification codes in said second memory for the function block identified by said not found first information code.

3. A method according to claim 1, wherein, when one or more second identification codes stored in said first memory are not found in said second memory for the logic elements of a function block replacing the second identification codes for that function block in said second memory in accordance with said first memory.

4. A method according to claim 1, wherein, when a third identification code in said first memory is not found in said second memory for an output signal of a function block, replacing the third identification code for that output signal in said second memory in accordance with said first memory.

5. A method according to claim 1, further comprising the step of:

(i) determining whether any first identification code in said second memory is not found in said first memory; and (j) deleting from said second memory the first, second and third identification codes related to the function block indicated by the first identification code not found in step (i).

* * * * *